United States Patent [19]

Heitzer

[11] Patent Number: 5,080,774

[45] Date of Patent: Jan. 14, 1992

[54] SURFACE CONFIGURATION MEANS FOR VACUUM COATING DEVICE

[75] Inventor: Xaver Heitzer, Cologne, Fed. Rep. of Germany

[73] Assignee: Saint-Gobain Vitrage, Courbevoie, France

[21] Appl. No.: 477,160

[22] Filed: Feb. 8, 1990

Related U.S. Application Data

[63] Continuation of Ser. No. 106,754, Oct. 6, 1987, abandoned.

[30] Foreign Application Priority Data

Oct. 11, 1986 [DE] Fed. Rep. of Germany ....... 3634710

[51] Int. Cl.⁵ .............................................. C23C 14/34
[52] U.S. Cl. ................................. 204/298.11; 118/50; 118/720; 118/729; 204/298.25
[58] Field of Search ...................... 204/298.06, 298.11, 204/298.14, 298.24, 298.25, 298.26, 298.23; 118/728, 729, 720, 50

[56] References Cited

U.S. PATENT DOCUMENTS

| | | | |
|---|---|---|---|
| 3,514,391 | 5/1970 | Hallanian et al. | 204/298 |
| 3,945,911 | 3/1976 | McKelvey | 204/298.25 |
| 4,100,055 | 7/1978 | Rainey | 204/298 |
| 4,313,815 | 2/1982 | Graves, Jr. et al. | 204/298 |
| 4,427,524 | 1/1984 | Crombeen et al. | 204/298 |
| 4,545,882 | 10/1985 | McKelvey | 204/298.25 |
| 4,699,702 | 10/1987 | Minakata et al. | 204/192.2 |

OTHER PUBLICATIONS

John L. Vossen et al, *Thin Film Processes*, Academic Press, New York, 1978, pp. 13, 32.

Primary Examiner—John Niebling
Assistant Examiner—William T. Leader
Attorney, Agent, or Firm—Pennie & Edmonds

[57] ABSTRACT

In a device for vacuum coating of a sheet such as a glass plate, especially by reactive cathode sputtering, with a film made from a semiconductor, a metal oxide or another metal compound, the parts within the coating chamber adjacent to the sheet (2) which are exposed to a particle stream coming from cathode (4) for example, screen or shielding plates (10), electrodes (8) and/or shielding plates (12), are provided with end areas (10') and/or protrusions that are shaped like a knife edge. Such an edge has been found to promote cracking along the edge which relieves stresses and reduces chipping and resultant damage to the coating being deposited on that sheet.

25 Claims, 2 Drawing Sheets

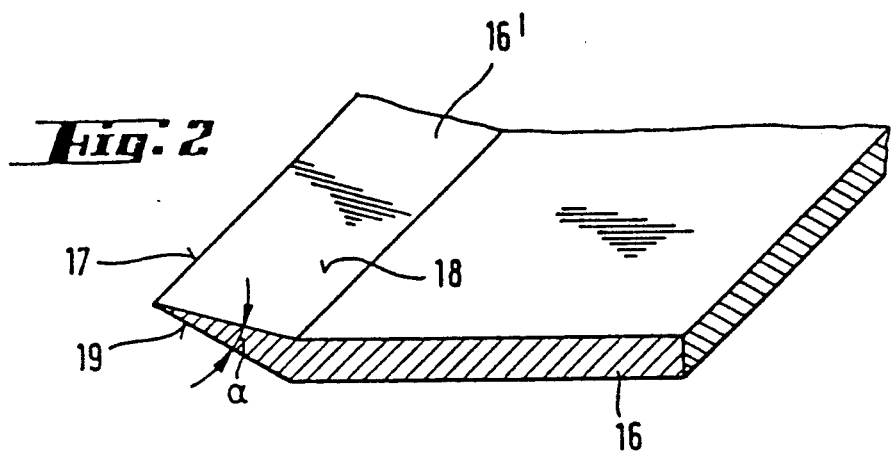
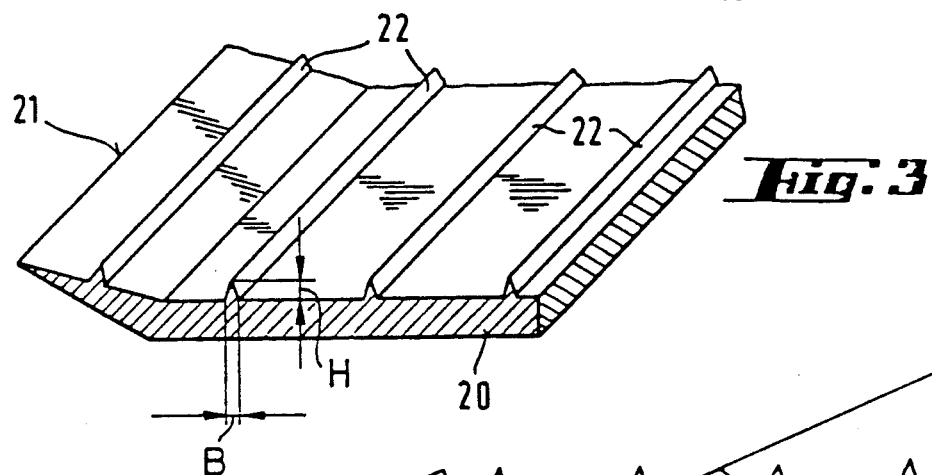
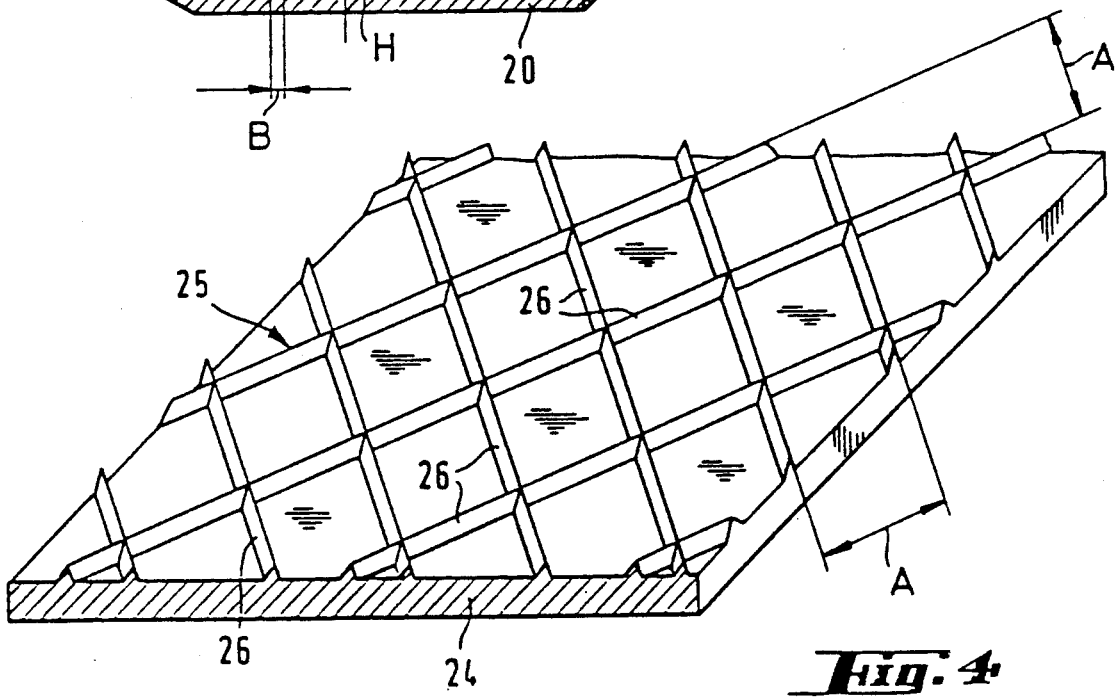

SURFACE CONFIGURATION MEANS FOR VACUUM COATING DEVICE

This is a continuation of application Ser. No. 07/106,754, filed Oct. 6, 1987, now abandoned.

FIELD OF THE INVENTION

The invention relates to a device for vacuum coating laminar sheets and in particular to a device for making such coatings by reactive cathode sputtering.

BACKGROUND OF THE INVENTION

Devices of this type are used for coating glass plates or plastic sheets with electrically conductive and/or heat-reflecting films. Generally, a base film is first applied to improve the adhesiveness of the substrate to be coated. This adhesive film can be formed of a metal oxide or a metal sulfide. Next a heat reflecting or electrically conductive film of gold, silver or copper is applied on top of the adhesive film. Finally, another metal oxide or metal sulfide film is applied for protection. A reliable film sequence for coating of silicate glass plates consists, e.g., of a tin dioxide film as the adhesive film, a silver film as the reflecting film, a thin metal oxide protective film, and finally an anti-reflection film of tin dioxide.

Vacuum coating devices work very economically if they operate according to the principle of magnetic field aided reactive cathode sputtering. To apply a metal oxide film with such a sputtering device, a metal target is used as a cathode. Atoms of the metal are knocked from the target in order to react with oxygen gas which is fed into the coating chamber. The resultant metal oxide is deposited on the substrate to form the desired film.

Vacuum coating devices, which operate according to the principle of cathode sputtering, usually contain additional devices between the cathode and the substrate. For example, anode electrodes are placed close to the cathodes to spread and stabilize the plasma cloud. For this purpose, an electric potential is applied to the anode electrode which is positive in relation to the electric potential of the cathode and to the potential of the metal housing of the vacuum chamber. Known anodes have the shape of round sections or tubes. Shielding plates or screens placed above the substrate are another example. The function of the screens is primarily to let only the high energy main beam of the sputtered particles reach the substrate surface by screening out the lower energy lateral portions of the particle beams. To achieve this result, a potential equal to or more positive than the ground potential of the coating housing is applied to these screens.

During operation of the installation, deposits of the coating material, which grow in thickness in the course of time, are formed on exposed surfaces within the vacuum chamber. Great mechanical stresses develop in these deposit films or between these deposit films and the metal base. These mechanical stresses can reach especially high values due to the temperature changes to which the coating installation is exposed, particularly during start up and shut down, since the metal components and the nonmetallic deposits have substantially different thermal expansion coefficients. Since the deposit films consist of nonductile, i.e., brittle material, the stresses cannot be reduced by plastic deformation. Over time as the deposits become increasingly thicker and the mechanical stresses become increasingly greater, the intrinsic strength of these deposit films is exceeded. Under the effect of these stresses, parts of the deposited films chip off from the base and fall or jump through the screen opening onto the substrate. As a result, coating defects occur on the substrate. To avoid such coating defects, the coating process must be interrupted at regular intervals to remove deposits from the affected components or to replace the affected components with clean components. These necessary interruptions drastically limit the productivity of the coating installation.

SUMMARY OF THE INVENTION

The object of the invention is to improve the productivity of vacuum coating installations by inhibiting accumulated coating material from chipping onto the substrate.

This object is achieved by providing the exposed surfaces with sharp protrusions similar to knife edges. I have found that these protrusions considerably reduce the danger of chipping and peeling of deposited coating material. The deposited material tends to crack along the sharp edges or projections thereby relieving much of the stress. Since the cracking is controlled, large fragments are formed which adhere at least partially to the base. The deposit films, cracked and partially lifted or loosened from the base, are partially refixed by further deposits.

In a preferred configuration of the invention the edge areas of the plate-shaped screens are designed in the form of a sharp edge so that a basically plane bottom surface intersects the upper surface of the screen at an angle equal to or less than 45 degrees. In this way, in addition to creating breaking points in the deposit films, the bottom surface of these components in its entire width is turned away from the cathode and the particle stream so that the possibility of the formation of deposit films on this surface is greatly reduced.

Further advantageous configurations of the invention are the object of the subclaims and are described in greater detail by means of the drawings.

BRIEF DESCRIPTION OF THE DRAWINGS

The objects, features and advantages of the present invention will be apparent from the following detailed description of the preferred embodiment in which:

FIG. 2 illustrates a modified embodiment of the end area of a screen designed according to the invention, on an enlarged scale;

FIG. 3 illustrates an embodiment of a screen surface designed according to the invention, and FIG. 4 illustrates another embodiment of the invention for a surface configuration of a shielding plate or another component in a coating chamber.

DESCRIPTION OF THE PREFERRED EMBODIMENT

Figure 1:
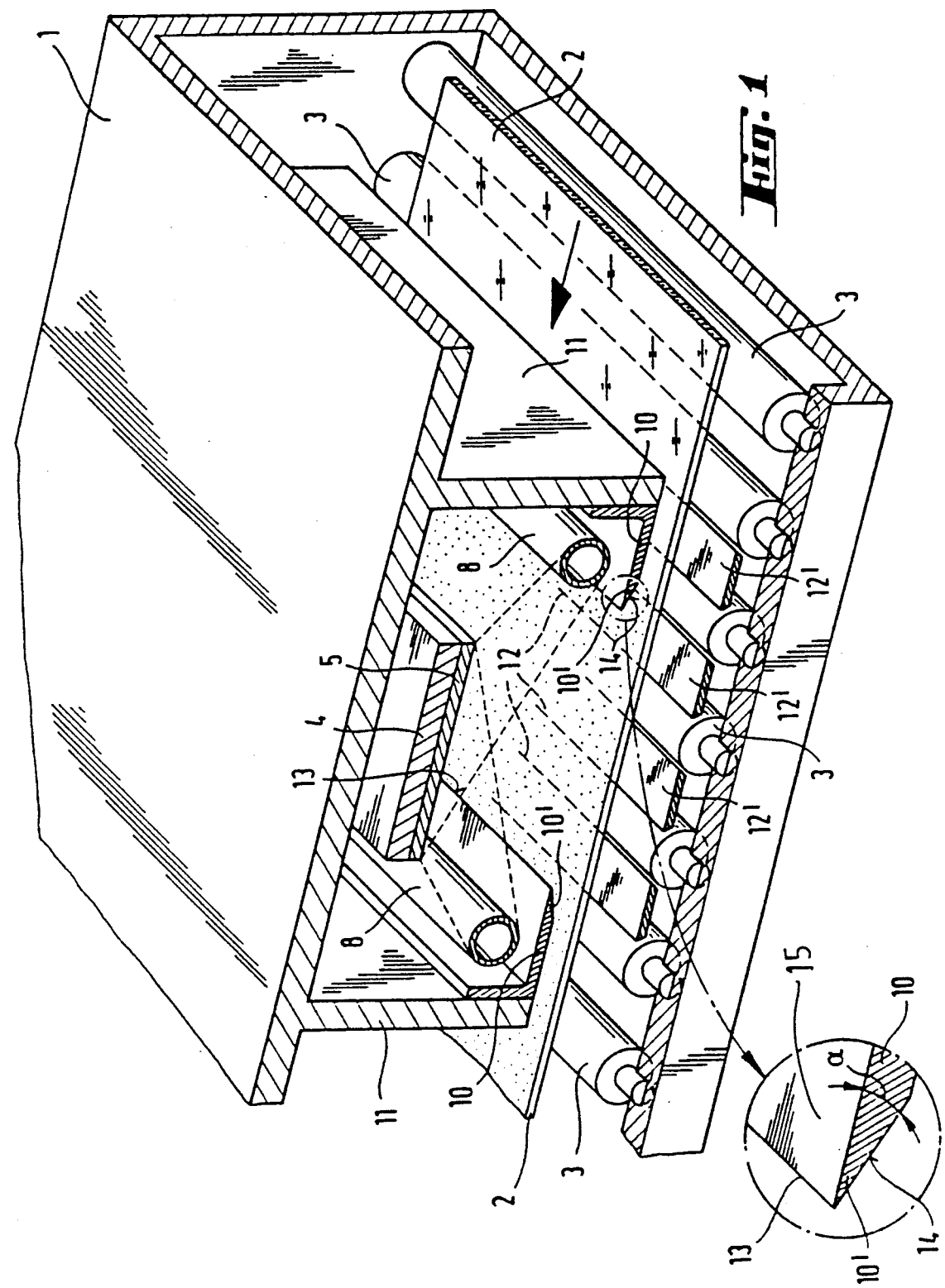
FIG. 1 illustrates a coating chamber of a continuous cathode sputtering installation for coating glass plates with their most important components, in a perspective view represented partially in section.

FIG. 1 depicts the basic design of a coating chamber within a continuous cathode sputtering installation for glass plates. The installation comprises of a hermetically sealed ductlike housing 1 of stable mechanical construction, through which glass plates 2 are passed by a conveyor belt formed by conveyor rollers 3. The actual coating part of the installation has several successive coating chambers; for example four coating chambers, if a coating sequence of four films is to be applied. Each coating chamber has basically the same design as shown in the center chamber of FIG. 1. Airlocks are located upstream and downstream from the coating chambers. The glass plates are first brought into the upstream airlock which is then evacuated. After evacuation, the plate is conveyed into the coating chamber without destroying that chamber's vacuum state. The downstream chamber operates in a similar manner to bring the plates out of the coating chamber.

An elongated cathode 4, which extends over the entire width of the installation or of the glass plates to be coated, is placed in the coating chamber opposite and parallel to conveyor rollers 3. Target 5, which consists of the material that is to be applied to the substrate by cathode sputtering, is fastened to the base of cathode 4. A negative voltage is applied to the cathode or target, while housing 1 is maintained at ground potential. Small amounts of gas, for example argon, are fed into the coating chamber by pipes (not shown). The gas molecules are ionized in the electric field and impinge with high velocity on the target surface knocking out metal atoms from the target surface. The metal ions thus emitted from the target are negatively charged particles which form a plasma cloud and which are accelerated toward surfaces which have an electric potential equal to or greater-than zero. Accordingly, these particles are deposited on the substrate surface and on other surfaces exposed to the plasma cloud within the coating chamber.

In the case of cathode sputtering aided by a magnetic field, the coating intensity is substantially increased by a strong magnetic field under the cathode. Strong permanent magnets are placed in the cathode for production of this magnetic field. For a better overall view, however, the magnet arrangement is not represented in the drawings.

To increase the stability of the plasma cloud and to spread the plasma cloud, two tubular anode bodies 8 are placed under cathode 4, parallel to it and symmetrically displaced on each side. Further, shielding plates or screens 10 are mounted on vertical boundary walls 11 of the coating chamber extending under these anode bodies 8, a short distance above glass plate 2. These screens intercept the lateral portions of the particle stream and allow passage only of the main particle stream, which impinges substantially vertically on the substrate surface. Screens 10 generally have ground potential.

The coating material is deposited on anode bodies 8, screens 10, as well as on the surface of the glass plate. In each case the deposits occur on the part of the surface exposed to the particle stream from the cathode. In addition, the coating material is deposited on head ends 12' of shielding plates 12 which project beyond glass plate 2 to protect conveyer rollers 3. Although shielding plates 12 are mounted below the plane of the glass plate, the deposits forming there can still reach the surface of the glass plate, since they can jump onto the glass plate surface under the effect of the stresses to which they are subjected.

Screens 10 are sheet metal plates several millimeters thick. The front edges of screens 10 represent the most critical sites from the viewpoint of the deposit of the coating material and the chipping of these coats. According to the invention, front edge region 10' is tapered like a knife. An angle alpha, formed by the top and bottom surfaces of edge region 10', is equal to or less than 45 degrees. A knifelike edge 13 runs in the plane of the upper surface 15 of the screen body. The lower surface of the screen body is provided with a single declining plane 14. Thus, deposits tend not to form on declining plane 14 since it is shielded by the upper surface 15.

A further embodiment that implements the above feature is represented in FIG. 2. In this case, a knifelike sharp edge 17 is formed by upper inclined plane 18 and lower inclined plane 19. The two inclined planes 18, 19 again form an angle alpha equal to or preferably less than 45 degrees. In this case, however, upper inclined plane 18 runs at an inclination, rising upward toward the target so that detached particles of a deposit film fall down along inclined plane 18 and remain on the screen body.

In the embodiment of screen 20 represented in FIG. 3, the upper surface of the screen body is also provided with several prismlike protrusions 22, which exhibit knifelike creases, running parallel to sharp edge 21. These prismlike protrusions 22 have a height H of 2 to 10 mm and preferably from 4 to 6 mm. Their breadth at the base area is 2 to 4 mm, and the angle formed by the prism surfaces which intersect at the peak of the protrusion is less than 45 degrees.

Alternatively, as represented by FIG. 4, the surfaces on which particles may be deposited can also be provided with a screenlike grid 25 of raised knifelike prism bodies 26. In this case prism bodies 26 can have the same measurements in cross section as prism bodies 22 in FIG. 3. Dimension A of prism bodies 26 can vary within broad limits; good results are obtained if distance A is 5 to 25 mm, and preferably 10 to 15 mm.

It is not necessary for prismlike protrusions 22 or screenlike grids 25 to be made in one piece with the respective base. Rather, the desired object is achieved just as well if the prism bodies or the screenlike grids are fastened as separate parts to the respective base. Certain embodiments of commercially available expanded metal sheets are suitable. For example, sheets which consist of a solid mesh network, which are produced from steel sheets by stamping and subsequent spreading, can be used as screenlike grids 25.

What is claimed is:

1. A vacuum coating apparatus for coating a transparent substrate in a horizontal position comprising:
    an elongated source means placed in a horizontal plane above the substrate for emitting coating substances, said source means having a length extending across the entire width of the apparatus,
    conveyor means below the substrate for continuously passing the substrate to be coated through a coating zone in a direction transverse to the length of the source means, and
    shielding means for defining the lateral boundaries of said coating zone by blocking stray emitted coating substances, said shielding means comprising at least one elongated plate, said plate having an end region, characterized in that said end region comprises a top surface which meets with a bottom surface of said end region at an acute angle to form a sharp edge, said sharp edge being substantially parallel to the length of said source means and defining said boundary of said coating zone.

2. The apparatus of claim 1 wherein said acute angle is approximately forty-five degrees or less.

3. The apparatus of claim 2 wherein said sharp edge is in the plane of the upper surface of the body of said plate.

4. The apparatus of claim 1 wherein said sharp edge also runs in a reference plane parallel to the plane of the upper surface of said plate, said reference plane being closer to said source means than said plane of said plate.

5. A device for magnetic field aided reactive cathode sputtering of a transparent laminar substrate in horizontal position with a film made from a semiconductor, a metal oxide or another metal compound, comprising an evacuable coating chamber, a conveyor for continously passing the substrate to be coated through a coating zone within the coating chamber, at least one elongated cathode carrying a coating material that is placed in a horizontal plane above the substrate, said cathode having a length extending across the entire width of the coating chamber in a direction transverse to the conveying direction and at least one elongated shielding plate placed inside the coating chamber for defining at least one lateral boundary of said coating zone by blocking stray emitted coating substances, a horizontal surface of said elongated shielding plate placed inside the coating chamber being provided with a a sharp edge that is formed by the intersection of a first planar surface and a second planar surface at an angle equal to or less than 45 degrees.

6. The apparatus of claim 5 wherein said sharp edge is substantially parallel to the length of said elongated cathode.

7. The apparatus of claim 6 wherein said first planar surface comprises a plane extending upward from a lower horizontal surface of said shielding plate towards said cathode.

8. The apparatus of claim 7 wherein said second planar surface comprises said horizontal surface of said shielding plate.

9. The apparatus of claim 7 wherein said second planar surface comprises a plane extending upward from said horizontal surface of said shielding plate towards said cathode.

10. The apparatus of claim 5 wherein said first and second planar surfaces comprise planes extending upward from said horizontal surface of said shielding plate towards said cathode to form a protrusion on said horizontal surface.

11. A device according to claim 10 wherein said protrusion is shaped like a knife edge and has a height of 2 to 10 mm.

12. A device according to claim 11 wherein said protrusion is a separate object fastened to a surface of said electrode or shielding plate.

13. A device according to claim 12 wherein the separate object is formed as a mesh.

14. A device according to claim 13 wherein the mesh is an expanded metal sheet.

15. A device for vacuum coating of a transparent substrate in a horizontal position comprising:
an evacuable coating chamber,
conveyor means below the substrate for continuously passing the substrate to be coated through a coating zone with the coating chamber,
at least one elongated source means carrying a coating material that is placed in a horizontal plane above the substrate, said source means having a length extending across the entire width of the coating chamber in a direction transverse to the conveying direction, and
at least one elongated shielding plate for defining at least one lateral boundary of the coating zone by blocking stray emitted coating material removably mounted inside the coating chamber and having a horizontal surface which is exposed to a particle stream coming from the source means, said shielding plate having first and second planar surfaces which extend upward from said horizontal surface towards said source means and intersect with one another at an acute angle to form a protrusion.

16. The apparatus of claim 15 wherein said coating material is nonmetallic.

17. The apparatus of claim 15 wherein said protrusion has a height, measured with respect to a base of said surface, of two to ten millimeters.

18. The apparatus of claim 17 wherein said protrusion is fastened to a base of said surface.

19. The apparatus of claim 15 wherein said protrusion is a mesh.

20. The apparatus of claim 19 wherein said mesh comprises an expanded metal sheet.

21. A vacuum coating apparatus for coating a transparent substrate in a horizontal position comprising:
an elongated source means placed in a horizontal plane above the substrate for emitting coating substances, said source means having a length extending across the entire width of the apparatus,
conveyor means below the substrate for continuously passing the substrate to be coated through a coating zone in a direction transverse to the length of the source means,
first shielding means for defining the lateral boundaries of said coating zone by blocking stray emitted coating substances, said shielding means comprising at least one elongated plate, said plate having an end region, characterized in that said end region comprises a top surface which meets with a bottom surface of said end region at an acute angle to form a sharp edge, said sharp edge being substantially parallel to the length of said source means and defining said boundary of said coating zone, and
a second shielding means below the substrate and above said conveyor means for shielding said conveyor means from stray emitted coating substances.

22. The apparatus of claim 21 wherein said conveyor means comprise a plurality of elongated rollers, said rollers being rotatably mounted in an adjacent relationship and extending across the entire width of the apparatus in a direction parallel to said source means.

23. The apparatus of claim 22 wherein said second shielding means comprises at least one elongated plate having a length extending across the entire width of the apparatus.

24. The apparatus of claim 23 wherein said second shielding means comprises a plurality of elongated plates positioned between said adjacent elongated rollers.

25. The apparatus of claim 24 wherein each of said shielding plates comprise an end region having a top surface which meets with a bottom surface at an acute angle to form a sharp edge.

* * * * *